(12) United States Patent
Chang et al.

(10) Patent No.: US 11,800,721 B2
(45) Date of Patent: Oct. 24, 2023

(54) FERROELECTRIC MEMORY STRUCTURE WITH DIFFERENT FERROELECTRIC CAPACITORS

(71) Applicant: Powerchip Semiconductor Manufacturing Corporation, Hsinchu (TW)

(72) Inventors: Shou-Zen Chang, Hsinchu (TW); Ming-Han Liao, Hsinchu (TW); Min-Cheng Chen, Hsinchu County (TW); Hiroshi Yoshida, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 263 days.

(21) Appl. No.: 17/403,871

(22) Filed: Aug. 16, 2021

(65) Prior Publication Data

US 2023/0038759 A1 Feb. 9, 2023

(30) Foreign Application Priority Data

Jul. 29, 2021 (TW) ................. 110127876

(51) Int. Cl.
*H10B 53/30* (2023.01)
*G11C 11/22* (2006.01)
(52) U.S. Cl.
CPC ............ *H10B 53/30* (2023.02); *G11C 11/221* (2013.01); *G11C 2213/70* (2013.01)
(58) Field of Classification Search
CPC ...... H10B 53/30; H10B 99/10; G11C 11/221; G11C 2213/70; H01L 28/55
See application file for complete search history.

(56) References Cited

U.S. PATENT DOCUMENTS 6,023,089 A * 2/2000 Kang .................. H01L 27/1203
257/361
8,389,971 B2 3/2013 Chen et al.
(Continued)

FOREIGN PATENT DOCUMENTS

TW 202010111 3/2020

OTHER PUBLICATIONS

"Under the law of the jungle in the field of storage, Fujitsu GM's 20-year focus on deducing the rise of the alternative", with English translation thereof, retrieved from "https://kknews.cc/tech/pykxxpp.html".

(Continued)

*Primary Examiner* — Jerome Leboeuf
(74) *Attorney, Agent, or Firm* — JCIPRNET

(57) ABSTRACT

A ferroelectric memory structure including a first conductive line, a second conductive line, and a memory cell is provided. The second conductive line is disposed on the first conductive line. The memory cell is disposed between the first and second conductive lines. The memory cell includes a switch device and a ferroelectric capacitor structure. The switch device is disposed between the first and second conductive lines. The ferroelectric capacitor structure is disposed between the first conductive line and the switch device. The ferroelectric capacitor structure includes ferroelectric capacitors electrically connected. Each of the ferroelectric capacitors includes a first conductive layer, a second conductive layer, and a ferroelectric material layer. The second conductive layer is disposed on the first conductive layer. The ferroelectric material layer is disposed between the first conductive layer and the second conductive layer. The ferroelectric material layers in the ferroelectric capacitors have different top-view areas.

18 Claims, 14 Drawing Sheets

(56) References Cited

U.S. PATENT DOCUMENTS

| | | |
|---|---|---|
| 8,841,648 B2 | 9/2014 | Chen et al. |
| 8,902,651 B2 | 12/2014 | Kwak et al. |
| 2005/0030821 A1 | 2/2005 | Tai |
| 2014/0175603 A1 | 6/2014 | Ananthan et al. |
| 2018/0082729 A1* | 3/2018 | Slesazeck ........... G11C 11/5657 |
| 2018/0305219 A1 | 10/2018 | Kikuchi et al. |
| 2020/0035683 A1 | 1/2020 | Sharma et al. |
| 2020/0212532 A1 | 7/2020 | Gosavi et al. |
| 2021/0202507 A1 | 7/2021 | Thareja et al. |
| 2021/0343787 A1* | 11/2021 | Goto ...................... H10B 63/30 |
| 2022/0139933 A1* | 5/2022 | Noack ................... G11C 11/221 |
| | | 365/145 |
| 2022/0319569 A1* | 10/2022 | Veches ................. H01L 23/5252 |
| 2023/0024307 A1* | 1/2023 | Lee ........................ H10B 53/30 |

OTHER PUBLICATIONS

Yoon Cheol Bae et al., "All oxide semiconductor-based bidirectional vertical p-n-p selectors for 3D stackable crossbar-array electronics", Scientific Reports, Aug. 20, 2015, pp. 1-11.

"Office Action of Taiwan Counterpart Application", dated Feb. 23, 2022, p. 1-p. 10.

* cited by examiner

FERROELECTRIC MEMORY STRUCTURE WITH DIFFERENT FERROELECTRIC CAPACITORS

CROSS-REFERENCE TO RELATED APPLICATION

This application claims the priority benefit of Taiwan application serial no. 110127876, filed on Jul. 29, 2021. The entirety of the above-mentioned patent application is hereby incorporated by reference herein and made a part of this specification.

BACKGROUND OF THE INVENTION

Field of the Invention

The invention relates to a memory structure, and particularly relates to a ferroelectric memory structure.

Description of Related Art

The ferroelectric memory is a non-volatile memory and has the advantage that the stored data will not disappear even after being powered off. In addition, compared with other non-volatile memory, the ferroelectric memory has the characteristics of high reliability and fast operation speed. However, how to increase the bit density of the ferroelectric memory is the goal of continuous efforts.

SUMMARY OF THE INVENTION

The invention provides a ferroelectric memory structure, which can have a higher bit density.

The invention provides a ferroelectric memory structure, which includes a first conductive line, a second conductive line, and a memory cell. The second conductive line is disposed on the first conductive line. The memory cell is disposed between the first conductive line and the second conductive line. The memory cell includes a switch device and a ferroelectric capacitor structure. The switch device is disposed between the first conductive line and the second conductive line. The ferroelectric capacitor structure is disposed between the first conductive line and the switch device. The ferroelectric capacitor structure includes ferroelectric capacitors electrically connected. Each of the ferroelectric capacitors includes a first conductive layer, a second conductive layer, and a ferroelectric material layer. The second conductive layer is disposed on the first conductive layer. The ferroelectric material layer is disposed between the first conductive layer and the second conductive layer. The ferroelectric material layers in the ferroelectric capacitors have different top-view areas.

According to an embodiment of the invention, in the ferroelectric memory structure, the ferroelectric capacitors may be connected in series.

According to an embodiment of the invention, in the ferroelectric memory structure, the ferroelectric capacitors may be connected in parallel.

According to an embodiment of the invention, in the ferroelectric memory structure, the ferroelectric capacitors may be located between the same first conductive line and the same switch device.

According to an embodiment of the invention, in the ferroelectric memory structure, the material of the ferroelectric material layer may include hafnium zirconium oxide (HfZrO$_x$, HZO), lead zirconate titanate (Pb[Zr$_x$Ti$_{1-x}$]O$_3$, PZT), strontium titanium oxide (SrTiO$_3$, STO), barium titanate (BaTiO$_3$, BTO), or bismuth ferrite (BiFeO$_3$, BFO).

According to an embodiment of the invention, in the ferroelectric memory structure, the switch device may be a bipolar junction transistor (BJT), a diode, or a metal oxide semiconductor field effect transistor (MOSFET).

According to an embodiment of the invention, in the ferroelectric memory structure, the switch device may be the BJT, and the switch device may include a first semiconductor layer, a second semiconductor layer, and a third semiconductor layer. The second semiconductor layer is disposed on the first semiconductor layer. The third semiconductor layer is disposed between the first semiconductor layer and the second semiconductor layer. The first semiconductor layer and the second semiconductor layer may have a first conductive type. The third semiconductor layer may have a second conductive type.

According to an embodiment of the invention, in the ferroelectric memory structure, the material of the first semiconductor layer and the material of the second semiconductor layer may be one of a P-type oxide semiconductor and an N-type oxide semiconductor, and the material of the third semiconductor layer may be the other of the P-type oxide semiconductor and the N-type oxide semiconductor.

According to an embodiment of the invention, in the ferroelectric memory structure, the P-type oxide semiconductor may include cobalt oxide (CoO$_x$), nickel oxide (NiO$_x$), strontium copper oxide (SrCu$_2$O$_x$), copper aluminum oxide (CuAlO$_2$), copper indium oxide (CuInO$_2$), or copper gallium oxide (CuGaO$_2$).

According to an embodiment of the invention, in the ferroelectric memory structure, the N-type oxide semiconductor may include indium gallium zinc oxide (IGZO), zinc oxide (ZnO), or indium zinc oxide (IZO).

According to an embodiment of the invention, the ferroelectric memory structure may include a plurality of the first conductive lines, a plurality of the second conductive lines, and a plurality of the memory cells to form a memory array.

According to an embodiment of the invention, the ferroelectric memory structure may include a plurality of the memory arrays arranged in a stack.

The invention provides another ferroelectric memory structure, which includes a first conductive line, a second conductive line, and a memory cell. The second conductive line is disposed on the first conductive line. The memory cell is disposed between the first conductive line and the second conductive line. The memory cell includes a switch device and a ferroelectric capacitor structure. The switch device is disposed between the first conductive line and the second conductive line. The ferroelectric capacitor structure is disposed between the first conductive line and the switch device. The ferroelectric capacitor structure includes ferroelectric capacitors electrically connected. Each of the ferroelectric capacitors includes a first conductive layer, a second conductive layer, and a ferroelectric material layer. The second conductive layer is disposed on the first conductive layer. The ferroelectric material layer is disposed between the first conductive layer and the second conductive layer. The ferroelectric material layers in the ferroelectric capacitors have different thicknesses.

According to another embodiment of the invention, in the ferroelectric memory structure, the ferroelectric capacitors may be connected in series.

According to another embodiment of the invention, in the ferroelectric memory structure, the ferroelectric capacitors may be connected in parallel.

According to another embodiment of the invention, in the ferroelectric memory structure, the ferroelectric capacitors may be located between the same first conductive line and the same switch device.

According to another embodiment of the invention, in the ferroelectric memory structure, the material of the ferroelectric material layer may include hafnium zirconium oxide (HZO), lead zirconate titanate (PZT), strontium titanium oxide (STO), barium titanate (BTO), or bismuth ferrite (BFO).

According to another embodiment of the invention, in the ferroelectric memory structure, the switch device may be a BJT, a diode, or a MOSFET.

According to another embodiment of the invention, in the ferroelectric memory structure, the switch device may be the BJT, and the switch device may include a first semiconductor layer, a second semiconductor layer, and a third semiconductor layer. The second semiconductor layer is disposed on the first semiconductor layer. The third semiconductor layer is disposed between the first semiconductor layer and the second semiconductor layer. The first semiconductor layer and the second semiconductor layer may have a first conductive type. The third semiconductor layer may have a second conductive type.

According to another embodiment of the invention, in the ferroelectric memory structure, the material of the first semiconductor layer and the material of the second semiconductor layer may be one of a P-type oxide semiconductor and an N-type oxide semiconductor, and the material of the third semiconductor layer may be the other of the P-type oxide semiconductor and the N-type oxide semiconductor.

According to another embodiment of the invention, in the ferroelectric memory structure, the P-type oxide semiconductor may include cobalt oxide ($CoO_x$), nickel oxide ($NiO_x$), strontium copper oxide ($SrCu_2O_x$), copper aluminum oxide ($CuAlO_2$), copper indium oxide ($CuInO_2$), or copper gallium oxide ($CuGaO_2$).

According to another embodiment of the invention, in the ferroelectric memory structure, the N-type oxide semiconductor may include indium gallium zinc oxide (IGZO), zinc oxide (ZnO), or indium zinc oxide (IZO).

According to another embodiment of the invention, the ferroelectric memory structure may include a plurality of the first conductive lines, a plurality of the second conductive lines, and a plurality of the memory cells to form a memory array.

According to another embodiment of the invention, the ferroelectric memory structure may include a plurality of the memory arrays arranged in a stack.

Based on the above description, in the ferroelectric memory structure according to the invention, a single memory cell includes the ferroelectric capacitors electrically connected, and the ferroelectric material layers in the ferroelectric capacitors have different top-view areas or different thicknesses. Therefore, a single memory cell can store multiple bits of data, thereby increasing the bit density of the memory device.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
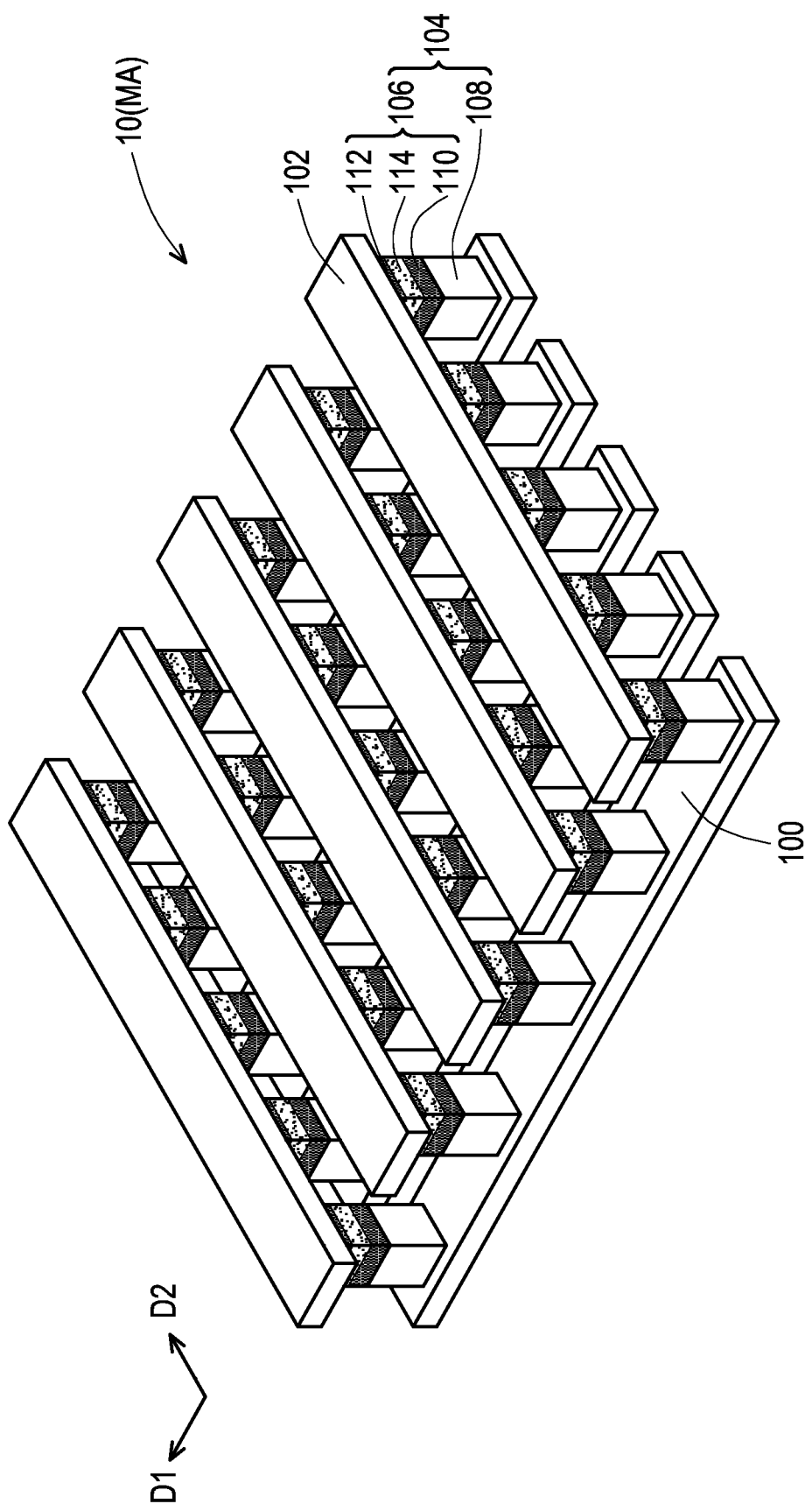
FIG. 1 is a schematic perspective view illustrating a ferroelectric memory structure according to some embodiments of the invention.
Figure 2A:
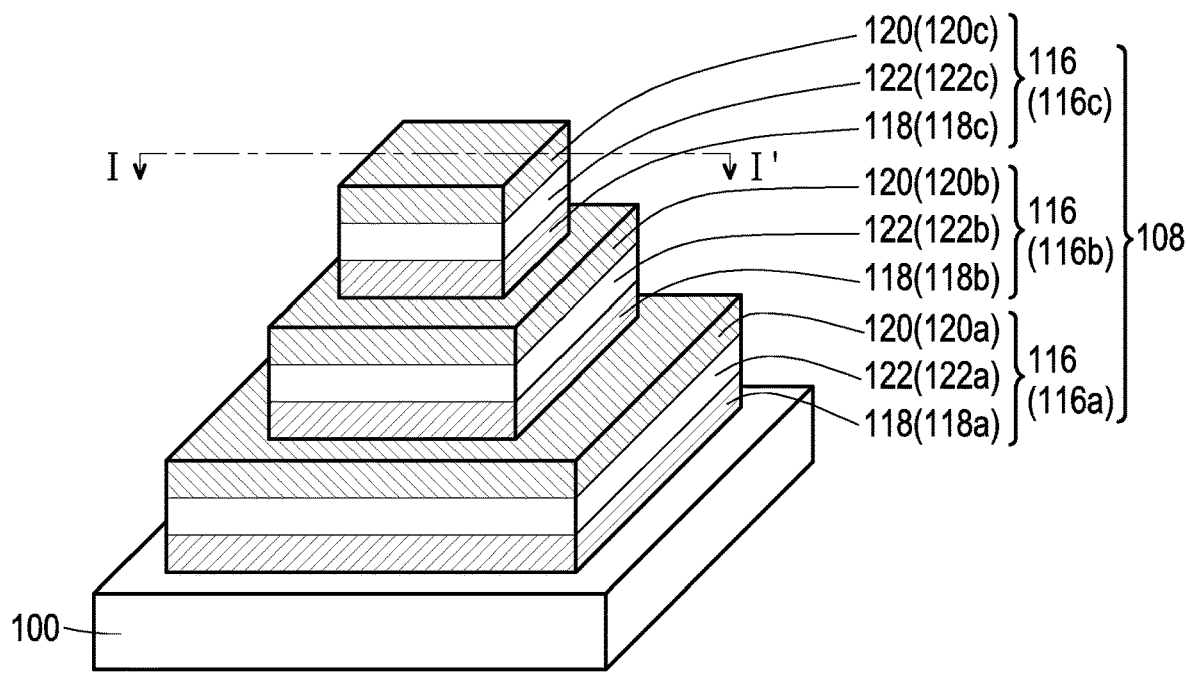
FIG. 2A to FIG. 2D are schematic perspective views illustrating a ferroelectric capacitor structure and a conductive line in FIG. 1 according to some embodiments of the invention.
Figure 2B:
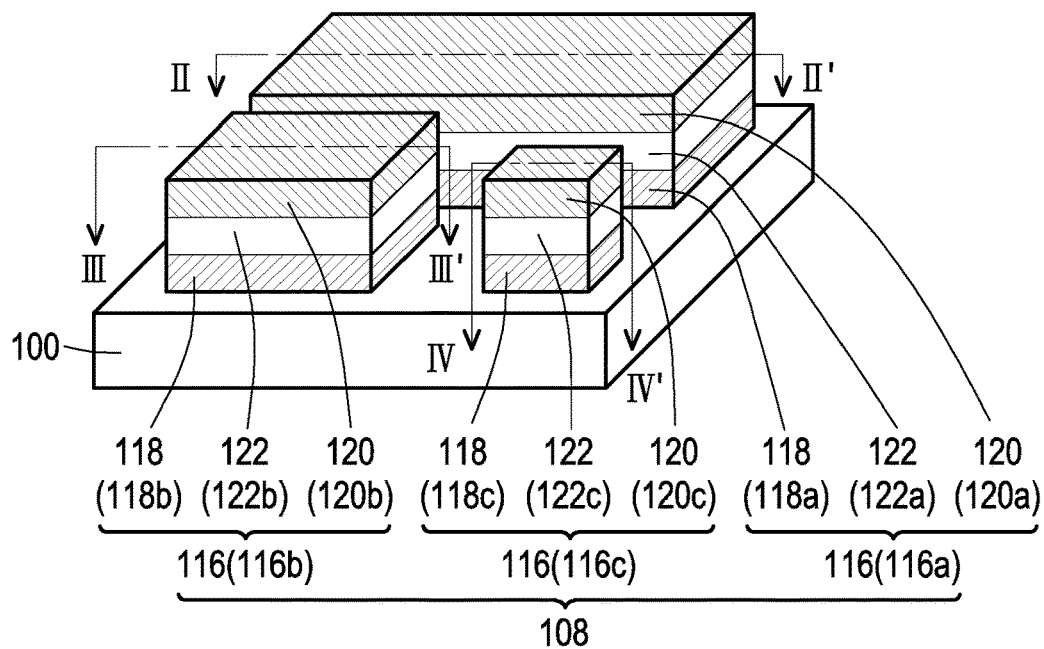
Figure 2C:
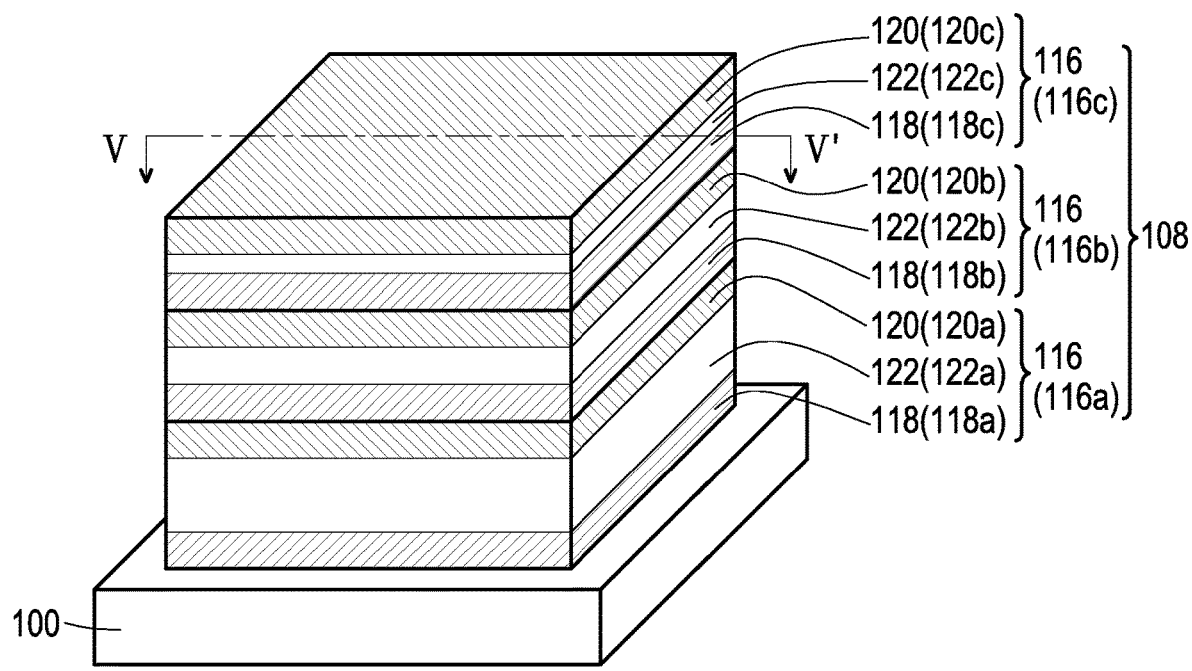
Figure 2D:
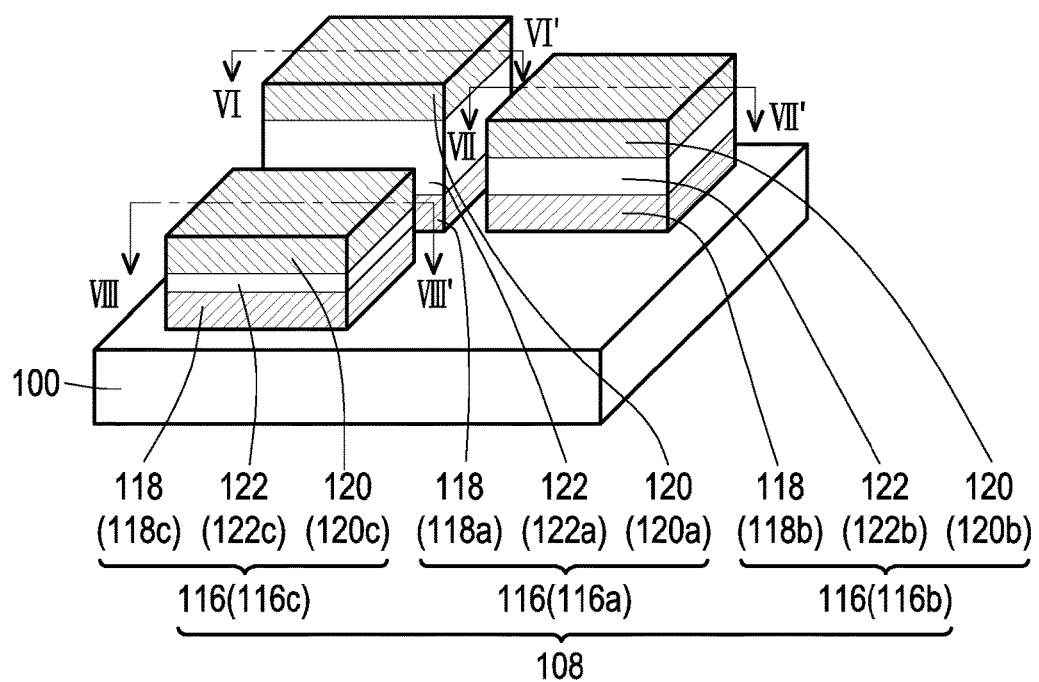
Figure 3A:
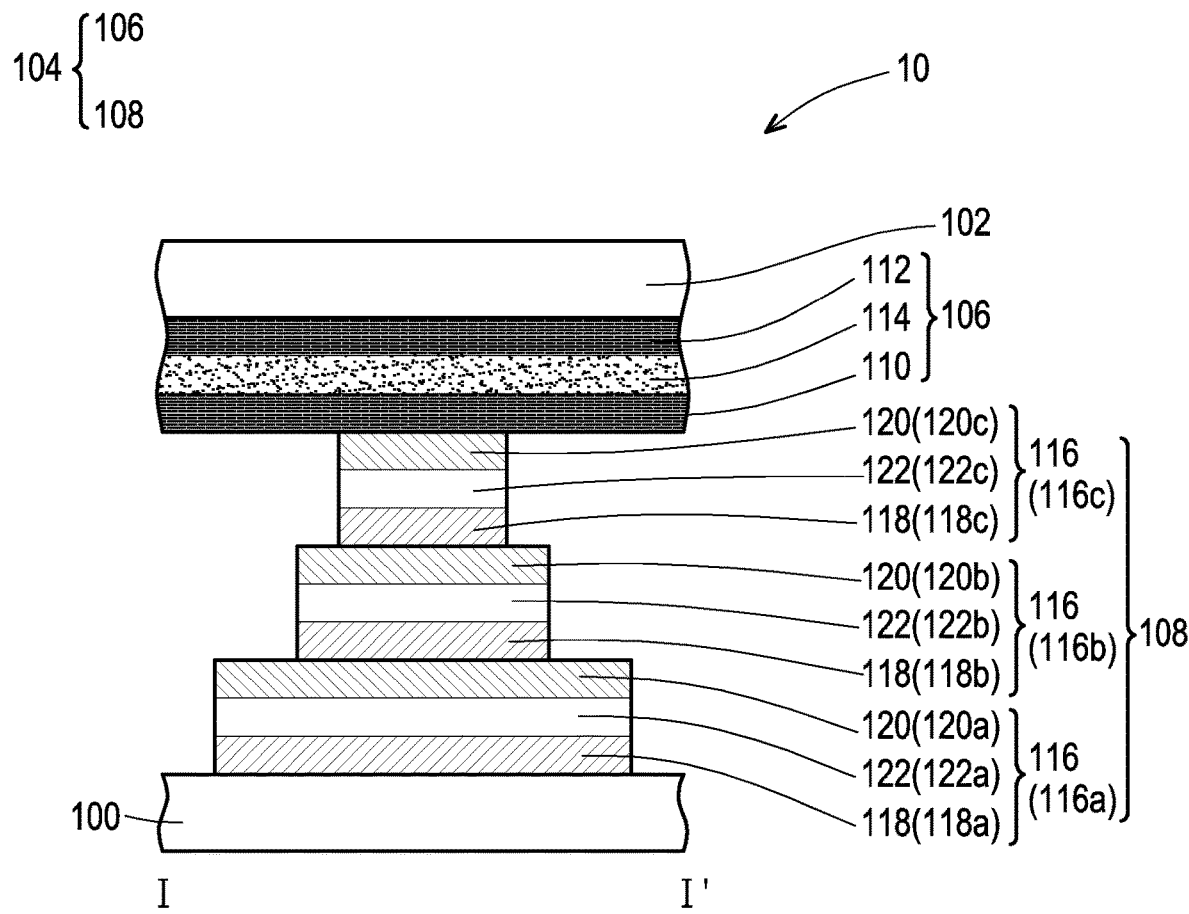
FIG. 3A is a cross-sectional view taken along section line I-I' in FIG. 2A.
Figure 3B:
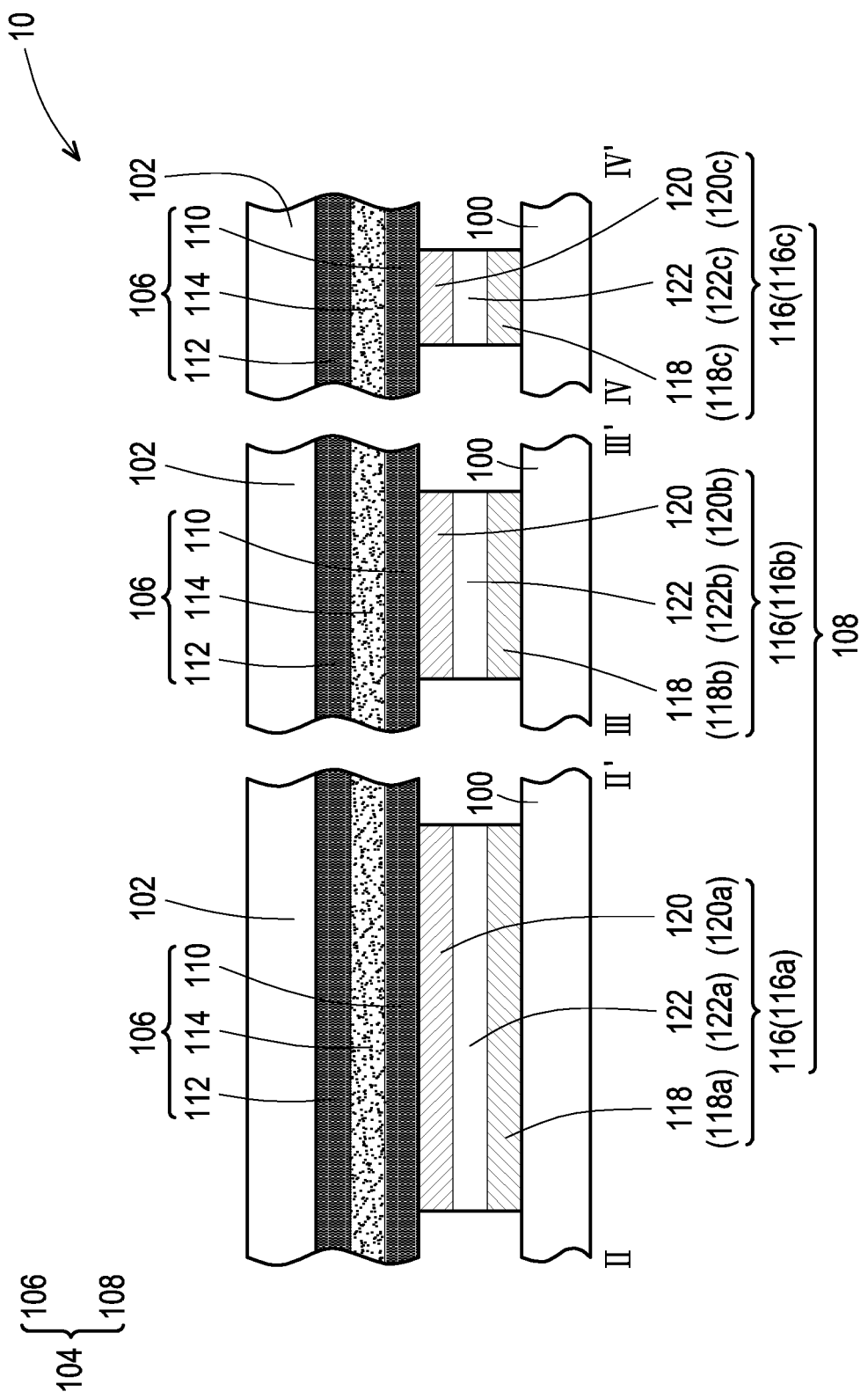
FIG. 3B is a cross-sectional view taken along section line II-II', section line III-III', and section line IV-IV' in FIG. 2B.
Figure 3C:
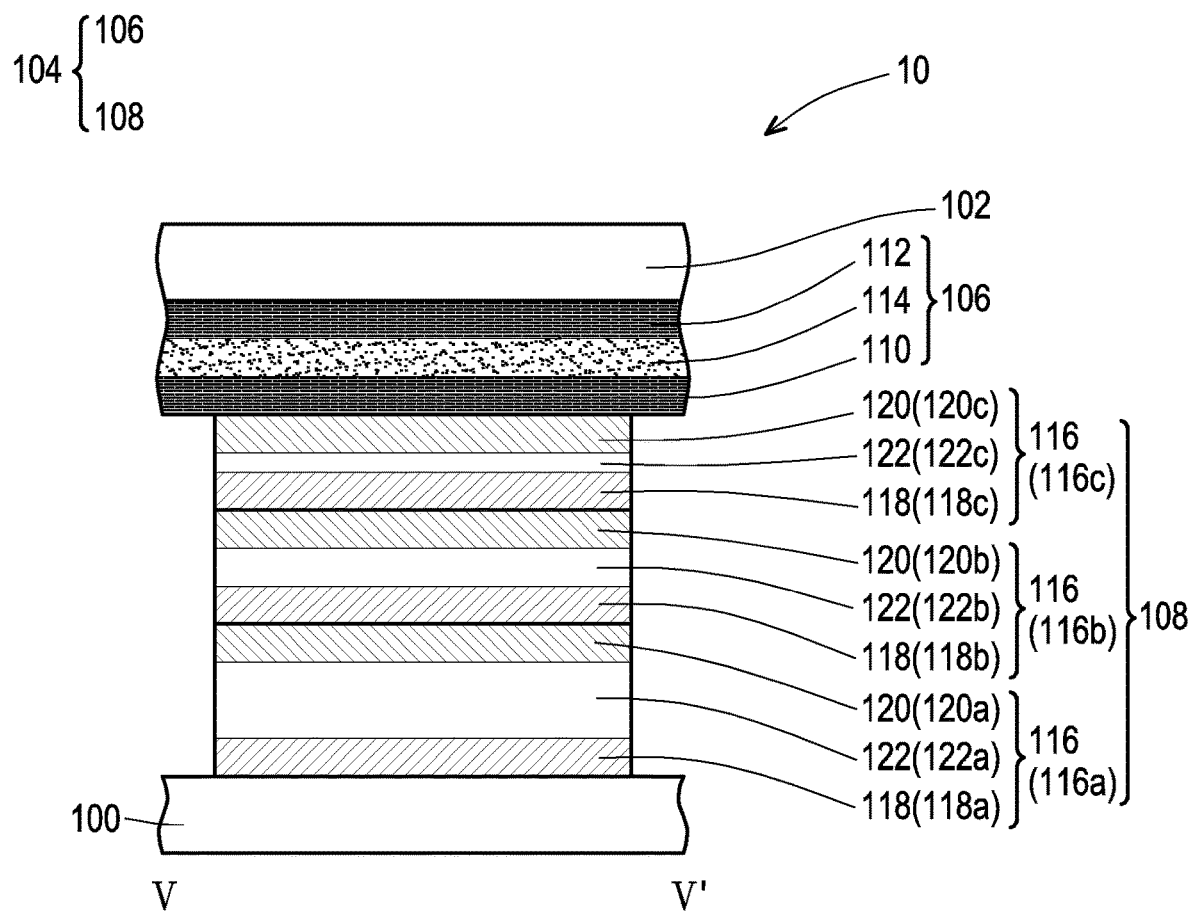
FIG. 3C is a cross-sectional view taken along section line V-V' in FIG. 2C.
Figure 3D:
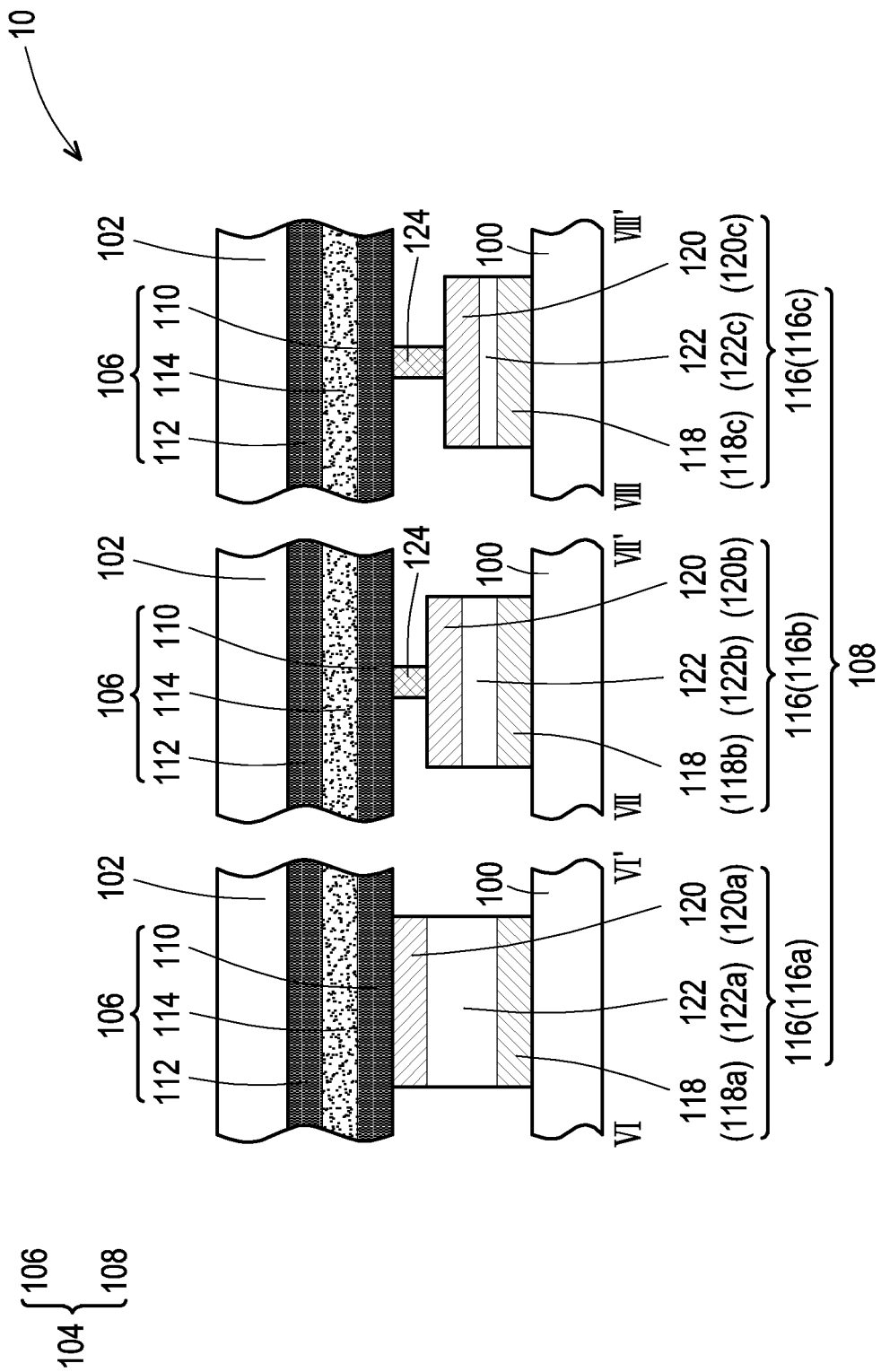
FIG. 3D is a cross-sectional view taken along section line VI-VI', section line VII-VII', and section line VIII-VIII' in FIG. 2D.

FIG. 1 is a schematic perspective view illustrating a ferroelectric memory structure according to some embodiments of the invention. FIG. 2A to FIG. 2D are schematic perspective views illustrating a ferroelectric capacitor structure and a conductive line in FIG. 1 according to some embodiments of the invention. FIG. 3A is a cross-sectional view taken along section line I-I' in FIG. 2A. FIG. 3B is a cross-sectional view taken along section line II-II', section line III-III', and section line IV-IV' in FIG. 2B. FIG. 3C is a cross-sectional view taken along section line V-V' in FIG. 2C. FIG. 3D is a cross-sectional view taken along section line VI-VI', section line VII-VII', and section line VIII-VIII' in FIG. 2D. In addition, in FIG. 2A to FIG. 2D, some components in FIG. 3A to FIG. 3D are omitted to clearly illustrate the configuration relationship between the components in FIG. 2A to FIG. 2D.

Referring to FIG. 1, FIG. 2A to FIG. 2D, and FIG. 3A to FIG. 3D, a ferroelectric memory structure 10 includes a conductive line 100, a conductive line 102, and a memory cell 104. In some embodiments, the ferroelectric memory structure 10 may be a ferroelectric random access memory (FRAM) structure. The ferroelectric memory structure 10 may be located on a substrate. In the following embodiments, in order to simplify the drawings, the substrate is not shown. In addition, the conductive line 102 is disposed on the conductive line 100. The material of the conductive line 100 and the material of the conductive line 102 may each include a conductive material such as metal (e.g., tungsten, aluminum, or copper).

In some embodiments, the ferroelectric memory structure 10 may include a plurality of the conductive lines 100, a plurality of the conductive lines 102, and a plurality of the memory cells 104 to form a memory array MA. In the memory array MA, the conductive lines 100 may extend in direction D1 and may be arranged in direction D2, and the conductive lines 102 may extend in direction D2 and may be arranged in direction D1. Furthermore, the direction D1 intersects the direction D2. In some embodiments, the ferroelectric memory structure 10 may include a plurality of the memory arrays MA arranged in a stack, so that the ferroelectric memory structure 10 may be a three-dimensional (3D) memory structure.

The memory cell 104 is disposed between the conductive line 100 and the conductive line 102. The memory cell 104 includes a switch device 106 and a ferroelectric capacitor structure 108. The switch device 106 is disposed between the conductive line 100 and the conductive line 102. In some embodiments, the switch device 106 may be a BJT, a diode, a MOSFET, or other suitable switch devices.

In the present embodiment, the switch device 106 may be the BJT, and the switch device 106 may include a semiconductor layer 110, a semiconductor layer 112, and a semiconductor layer 114, but the invention is not limited thereto. The semiconductor layer 112 is disposed on the semiconductor layer 110. The semiconductor layer 114 is disposed between the semiconductor layer 110 and the semiconductor layer 112.

The semiconductor layer 110 and the semiconductor layer 112 may have a first conductive type. The semiconductor layer 114 may have a second conductive type. The first conductive type and the second conductive type are different conductive types. Hereinafter, the first conductive type and the second conductive type may be one and the other of the P-type conductive type and the N-type conductive type, respectively. For example, when the first conductive type is the P type and the second conductive type is the N type, the switch device 106 may be a PNP BJT. Moreover, when the first conductive type is N-type and the second conductive type is P-type, the switch device 106 may be an NPN BJT.

In some embodiments, the material of the semiconductor layer 110 and the material of the semiconductor layer 112 may be one of a P-type oxide semiconductor and an N-type oxide semiconductor, and the material of the semiconductor layer 114 may be the other of the P-type oxide semiconductor and the N-type oxide semiconductor. For example, when the switch device 106 is the PNP BJT, the material of the semiconductor layer 110 and the material of the semiconductor layer 112 may be the P-type oxide semiconductor, and the material of the semiconductor layer 114 may be the N-type oxide semiconductor. In addition, when the switch device 106 is the NPN BJT, the material of the semiconductor layer 110 and the material of the semiconductor layer 112 may be the N-type oxide semiconductor, and the material of the semiconductor layer 114 may be the P-type oxide semiconductor.

In some embodiments, the P-type oxide semiconductor may be a transparent conducting metal oxide. For example, the P-type oxide semiconductor may include cobalt oxide ($CoO_x$), nickel oxide ($NiO_x$), strontium copper oxide ($SrCu_2O_x$), copper aluminum oxide ($CuAlO_2$), copper indium oxide ($CuInO_2$), or copper gallium oxide ($CuGaO_2$). In some embodiments, the N-type oxide semiconductor may include a transparent amorphous oxide semiconductor or an ionic amorphous oxide semiconductor. For example, the N-type oxide semiconductor may include indium gallium zinc oxide (IGZO), zinc oxide (ZnO), or indium zinc oxide (IZO).

The ferroelectric capacitor structure 108 is disposed between the conductive line 100 and the switch device 106. In some embodiments, the ferroelectric capacitors 116 may be located between the same conductive line 100 and the same switch device 106. In the present embodiment, although the ferroelectric capacitor structure 108 is disposed between the conductive line 100 and the switch device 106, the invention is not limited thereto. In other embodiments, the ferroelectric capacitor structure 108 may be disposed between the conductive line 102 and the switch device 106.

The ferroelectric capacitor structure 108 includes ferroelectric capacitors 116 electrically connected. In the present embodiment, the number of the ferroelectric capacitors 116 electrically connected in the ferroelectric capacitor structure 108 is, for example, three, but the invention is not limited thereto. As long as the ferroelectric capacitor structure 108 includes at least two ferroelectric capacitors 116 electrically connected, it falls within the scope of the invention. Each of the ferroelectric capacitors 116 includes a conductive layer 118, a conductive layer 120, and a ferroelectric material layer 122. The conductive layer 120 is disposed on the conductive layer 118. The material of the conductive layer 118 and the material of the conductive layer 120 may each include a conductive material such as metal. The ferroelectric material layer 122 is disposed between the conductive layer 118 and the conductive layer 120. Furthermore, the ferroelectric material layers 122 in the ferroelectric capacitors 116 are separated from each other. The ferroelectric material layer 122 may be used as a ferroelectric insulating layer. The material of the ferroelectric material layer 122 may include hafnium zirconium oxide (HZO), lead zirconate titanate (PZT), strontium titanium oxide (STO), barium titanate (BTO), or bismuth ferrite (BFO).

In some embodiments, as shown in FIG. 2A, FIG. 2C, FIG. 3A, and FIG. 3C, the ferroelectric capacitors 116 may be arranged in a stack on the conductive line 100. In the ferroelectric capacitor structure 108, the stacking sequence of the ferroelectric capacitors 116 may be adjusted according to the product requirement and is not limited to the stacking sequence in the figure. For example, in FIG. 2A and FIG. 3A, the ferroelectric capacitor 116a, the ferroelectric capacitor 116b, and the ferroelectric capacitor 116c are sequentially stacked on the conductive line 100, but the invention is not limited thereto. In other embodiments, the position of the ferroelectric capacitor 116a and the position of the ferroelectric capacitor 116c may be interchanged, that is, the ferroelectric capacitor 116c, the ferroelectric capacitor 116b, and the ferroelectric capacitor 116a may be sequentially stacked on the conductive line 100. In some embodiments, as shown in FIG. 2B, FIG. 2D, FIG. 3B, and FIG. 3D, the ferroelectric capacitors 116 may be horizontally arranged on the conductive line 100.

In some embodiments, as shown in FIG. 2A, FIG. 2B, FIG. 3A, and FIG. 3B, the ferroelectric material layers 122 in the ferroelectric capacitors 116 have different top-view areas, so that the ferroelectric capacitors 116 can have different impedances (e.g., capacitances). For example, as shown in FIG. 2A, FIG. 2B, FIG. 3A, and FIG. 3B, the top-view area of the ferroelectric material layer 122a may be larger than the top-view area of the ferroelectric material layer 122b, and the top-view area of the ferroelectric material layer 122b may be larger than the top-view area of the ferroelectric material layer 122c. In some embodiments, as shown in FIG. 2A, FIG. 2B, FIG. 3A, and FIG. 3B, the ferroelectric material layers 122 in the ferroelectric capacitors 116 may have the same thickness, but the invention is not limited thereto.

In some embodiments, as shown in FIG. 2C, FIG. 2D, FIG. 3C, and FIG. 3D, the ferroelectric material layers 122 in the ferroelectric capacitors 116 have different thicknesses, so that the ferroelectric capacitors 116 can have different impedances (e.g., capacitances). For example, as shown in FIG. 2C, FIG. 2D, FIG. 3C, and FIG. 3D, the thickness of the ferroelectric material layer 122*a* may be greater than the thickness of the ferroelectric material layer 122*b*, and the thickness of the ferroelectric material layer 122*b* may be greater than the thickness of the ferroelectric material layer 122*c*. In some embodiments, as shown in FIG. 2C, FIG. 2D, FIG. 3C, and FIG. 3D, the ferroelectric material layers 122 in the ferroelectric capacitors 116 may have the same top-view area, but the invention is not limited thereto.

That is, the top-view areas and/or the thicknesses of the ferroelectric material layers 122 in the ferroelectric capacitors 116 may be adjusted to make the ferroelectric capacitors 116 have different impedances (e.g., capacitances).

In some embodiments, as shown in FIG. 3A and FIG. 3C, the ferroelectric capacitors 116 may be connected in series. For example, in FIG. 3A and FIG. 3C, the conductive layer 120*a* of the ferroelectric capacitor 116*a* may be electrically connected to the conductive layer 118*b* of the ferroelectric capacitor 116*b*, and the conductive layer 120*b* of the ferroelectric capacitor 116*b* may be electrically connected to the conductive layer 118*c* of the capacitor 116*c*, so that the ferroelectric capacitors 116 (e.g., ferroelectric capacitor 116*a*, ferroelectric capacitor 116*b*, and ferroelectric capacitor 116*c*) may be connected in series, but the invention is not limited thereto. In other embodiments, two adjacent ferroelectric capacitors 116 may share a conductive layer, so that the ferroelectric capacitors 116 (e.g., ferroelectric capacitor 116*a*, ferroelectric capacitor 116*b*, and ferroelectric capacitor 116*c*) may be connected in series. For example, when the conductive layer 118*b* and the conductive layer 118*c* are omitted, the ferroelectric capacitor 116*a* and the ferroelectric capacitor 116*b* may share the conductive layer 120*a*, and the ferroelectric capacitor 116*b* and the ferroelectric capacitor 116*c* may share the conductive layer 120*b*, so that the ferroelectric capacitors 116 (e.g., ferroelectric capacitor 116*a*, ferroelectric capacitor 116*b*, and ferroelectric capacitor 116*c*) may be connected in series.

In addition, in FIG. 3A and FIG. 3C, the conductive layer 118*a* of the ferroelectric capacitor 116*a* may be electrically connected to the conductive line 100, and the conductive layer 120*c* of the ferroelectric capacitor 116*c* may be electrically connected to the semiconductor layer 110 of the switch device 106. In some embodiments, as shown in FIG. 3A and FIG. 3C, the conductive layer 118*a* of the ferroelectric capacitor 116*a* may be directly connected to the conductive line 100, and the conductive layer 120*c* of the ferroelectric capacitor 116*c* may be directly connected to the semiconductor layer 110 of the switch device 106, but the invention is not limited thereto. In other embodiments, the conductive layer 118*a* of the ferroelectric capacitor 116*a* may be electrically connected to the conductive line 100 by a conductive member (e.g., contact) (not shown). In other embodiments, the conductive layer 120*c* of the ferroelectric capacitor 116*c* may be electrically connected to the semiconductor layer 110 of the switch device 106 by a conductive member (e.g., contact) (not shown).

In some embodiments, as shown in FIG. 3B, the ferroelectric capacitors 116 may be connected in parallel. For example, as shown in FIG. 3B, when the ferroelectric capacitors 116 are separated from each other, the conductive layers 118 of the ferroelectric capacitors 116 may be electrically connected to the same conductive line 100 respectively, and the conductive layers 120 of the ferroelectric capacitors 116 may be electrically connected to the semiconductor layer 110 of the same switch device 106 respectively, so that the ferroelectric capacitors 116 (e.g., ferroelectric capacitor 116*a*, ferroelectric capacitor 116*b*, and ferroelectric capacitor 116*c*) may be connected in parallel, but the invention is not limited thereto. In other embodiments, the conductive layer 118*a* of the ferroelectric capacitor 116*a*, the conductive layer 118*b* of the ferroelectric capacitor 116*b*, and the conductive layer 118*c* of the ferroelectric capacitor 116*c* may be connected to each other to form a single conductive layer, and the conductive layer 120*a* of the ferroelectric capacitor 116*a*, the conductive layer 120*b* of the ferroelectric capacitor 116*b*, and the conductive layer 120*c* of the ferroelectric capacitor 116*c* may be connected to each other to form a single conductive layer, so that the ferroelectric capacitors 116 (e.g., ferroelectric capacitor 116*a*, ferroelectric capacitor 116*b*, and ferroelectric capacitor 116*c*) may be connected in parallel.

In FIG. 3B, the conductive layers 118 of the ferroelectric capacitors 116 may be directly connected to the same conductive line 100, but the invention is not limited thereto. Furthermore, in FIG. 3B, the conductive layers 120 of the ferroelectric capacitors 116 may be directly connected to the semiconductor layer 110 of the same switch device 106, but the invention is not limited thereto. In other embodiments, the conductive layers 118 of the ferroelectric capacitors 116 may be electrically connected to the same conductive line 100 by a conductive member (e.g., contact) (not shown), respectively. In other embodiments, the conductive layers 120 of the ferroelectric capacitors 116 may be electrically connected to the semiconductor layer 110 of the same switch device 106 by a conductive member (e.g., contact) (not shown), respectively.

In some embodiments, as shown in FIG. 3D, the ferroelectric capacitors 116 may be connected in parallel. For example, as shown in FIG. 3D, when the ferroelectric capacitors 116 are separated from each other, the conductive layers 118 of the ferroelectric capacitors 116 may be electrically connected to the same conductive line 100 respectively, and the conductive layers 120 of the ferroelectric capacitors 116 may be electrically connected to the semiconductor layer 110 of the same switch device 106 respectively, so that the ferroelectric capacitors 116 (e.g., ferroelectric capacitor 116*a*, ferroelectric capacitor 116*b*, and ferroelectric capacitor 116*c*) may be connected in parallel, but the invention is not limited thereto. In other embodiments, the conductive layer 118*a* of the ferroelectric capacitor 116*a*, the conductive layer 118*b* of the ferroelectric capacitor 116*b*, and the conductive layer 118*c* of the ferroelectric capacitor 116*c* may be connected to each other to form a single conductive layer.

In FIG. 3D, the conductive layers 118 of the ferroelectric capacitors 116 may be directly connected to the same conductive line 100, but the invention is not limited thereto. In other embodiments, the conductive layers 118 may be electrically connected to the same conductive line 100 by a conductive member (e.g., contact) (not shown), respectively. Moreover, in FIG. 3D, the conductive layers 120 of the ferroelectric capacitors 116 may be directly connected to the semiconductor layer 110 of the switch device 106 or electrically connected to the semiconductor layer 110 of the switch device 106 by a conductive member (e.g., contact 124). As shown in FIG. 3D, the conductive layer 120*a* of the ferroelectric capacitor 116a may be directly connected to the semiconductor layer 110 of the switch device 106, but the invention is not limited thereto. In other embodiments, the conductive layer 120a of the ferroelectric capacitor 116a may be electrically connected to the semiconductor layer 110 of the switch device 106 by a conductive member (e.g., contact) (not shown). In addition, as shown in FIG. 3D, the conductive layer 120b of the ferroelectric capacitor 116b and the conductive layer 120c of the ferroelectric capacitor 116c may be electrically connected to the semiconductor layer 110 of the switch device 106 by the contact 124, respectively.

Furthermore, the ferroelectric memory structure 10 may further include other required dielectric layers (for isolation) and/or other required interconnect structures (for electrical connection), and the description thereof is omitted here.

Hereinafter, Table 1 is used to illustrate various storage states of the memory cell 104 of the ferroelectric memory structure 10. By controlling the voltages applied to the conductive line 100 and the conductive line 102, the ferroelectric capacitor 116 may have a polarization state of "positive (+) direction" or a polarization state of "negative (−) direction". When the ferroelectric capacitor 116 has the polarization state of "positive (+) direction", the ferroelectric capacitor 116 may have a low impedance $Z_L$ and is regarded as storing a first data (e.g., data "0"). When the ferroelectric capacitor 116 has the polarization state of "negative (−) direction", the ferroelectric capacitor 116 may have a high impedance $Z_H$ and is regarded as storing a second data (e.g., data "1"). In the present embodiment, the impedance is, for example, a capacitance, but the invention is not limited thereto. Thus, when the memory cell 104 is operated, by controlling the voltages applied to the conductive line 100 and the conductive line 102, the ferroelectric capacitor 116a may have a low impedance $Z_{L1}$ or a high impedance $Z_{H1}$, the ferroelectric capacitor 116b may have a low impedance $Z_{L2}$ or a high impedance $Z_{H2}$, and the ferroelectric capacitor 116c may have a low impedance $Z_{L3}$ or a high impedance $Z_{H3}$. Therefore, a single memory cell 104 may have 8 different storage states (i.e., "000", "001", "010", "011", "100", "101", "110", and "111"). That is, a single memory cell 104 may store 3 bits of data.

Figure 4:
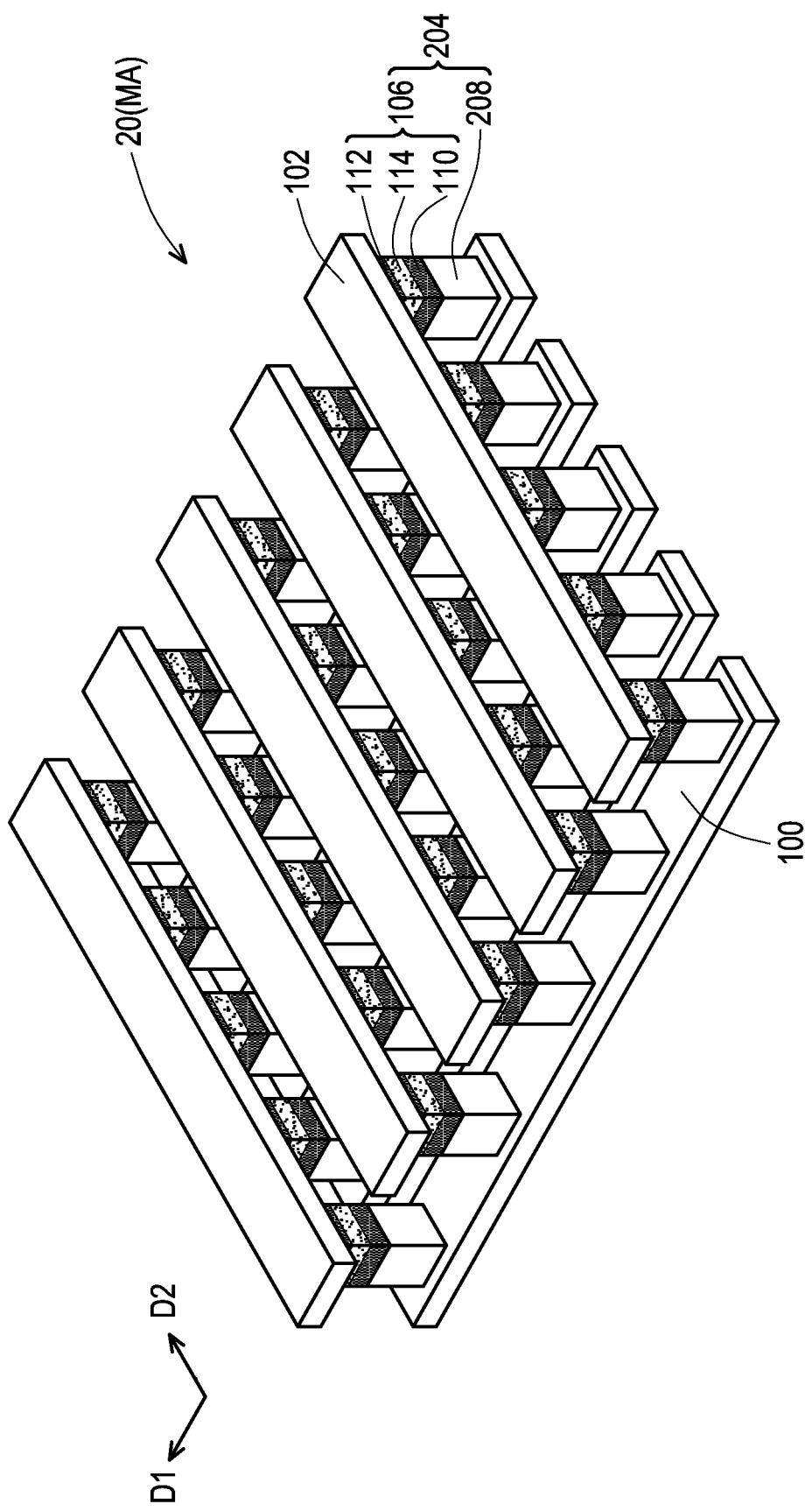
FIG. 4 is a schematic perspective view illustrating a ferroelectric memory structure according to another embodiments of the invention.
Figure 5A:
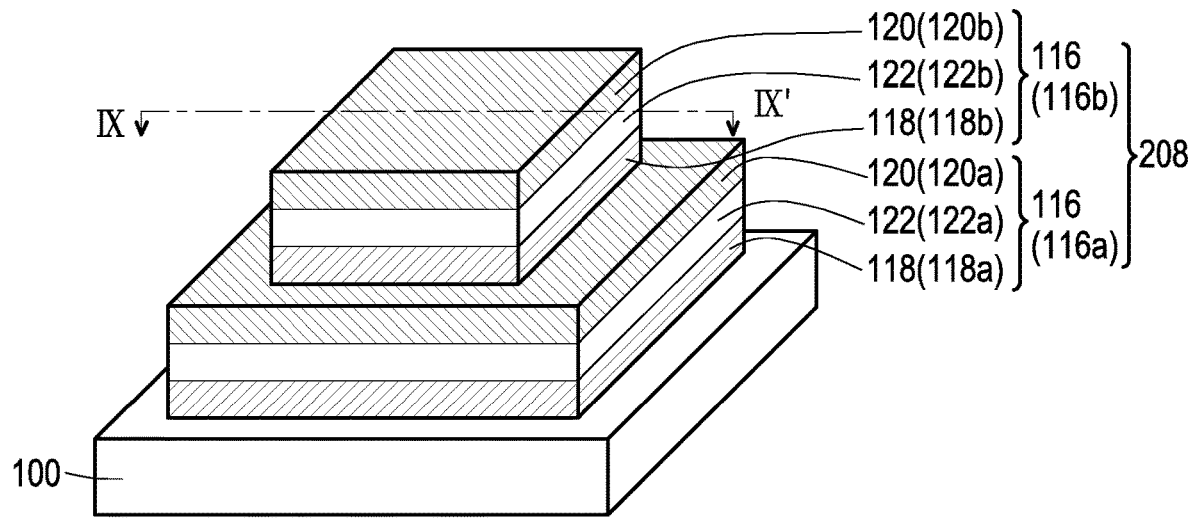
FIG. 5A to FIG. 5D are schematic perspective views illustrating a ferroelectric capacitor structure and a conductive line in FIG. 4 according to another embodiments of the invention.
Figure 5B:
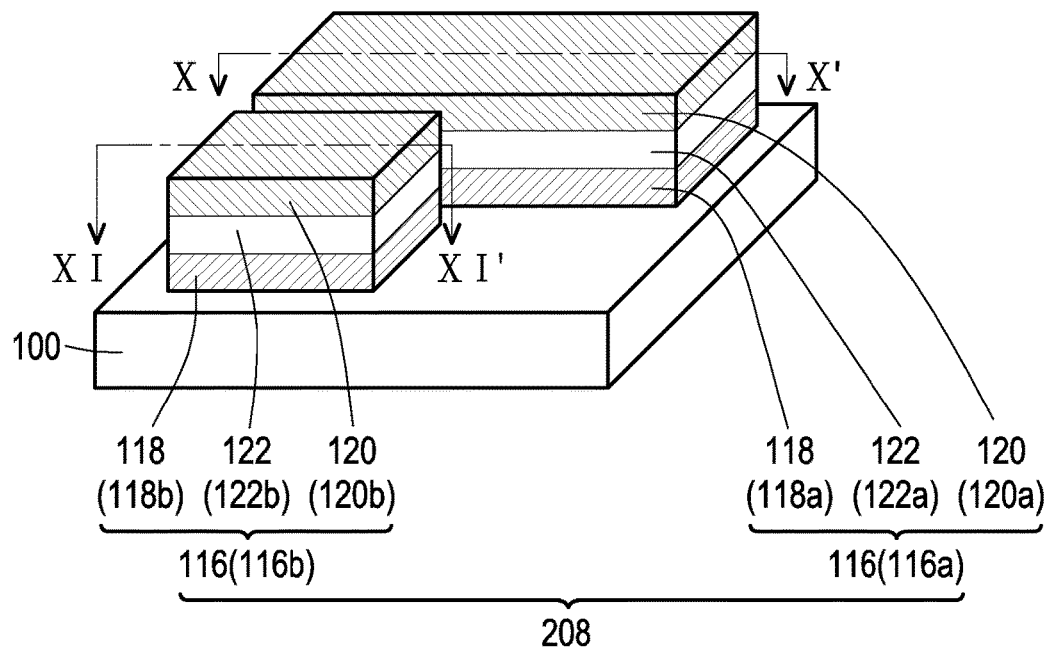
Figure 5C:
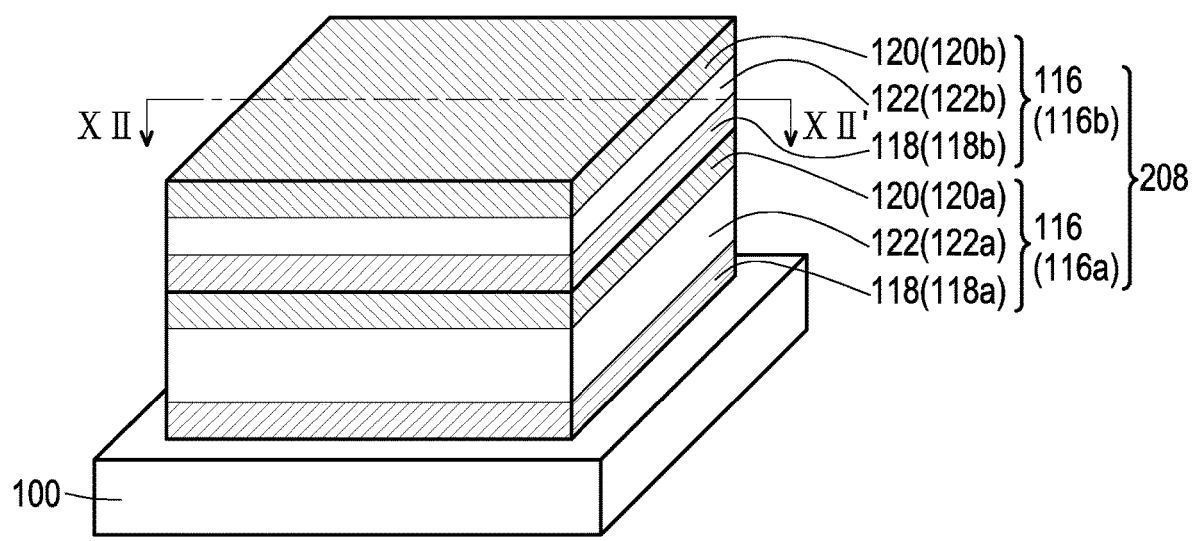
Figure 5D:
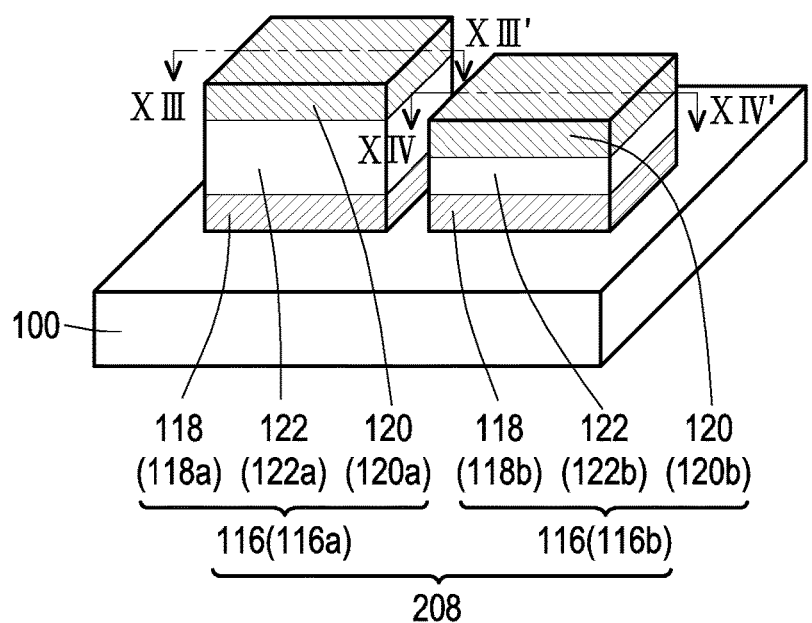
Figure 6A:
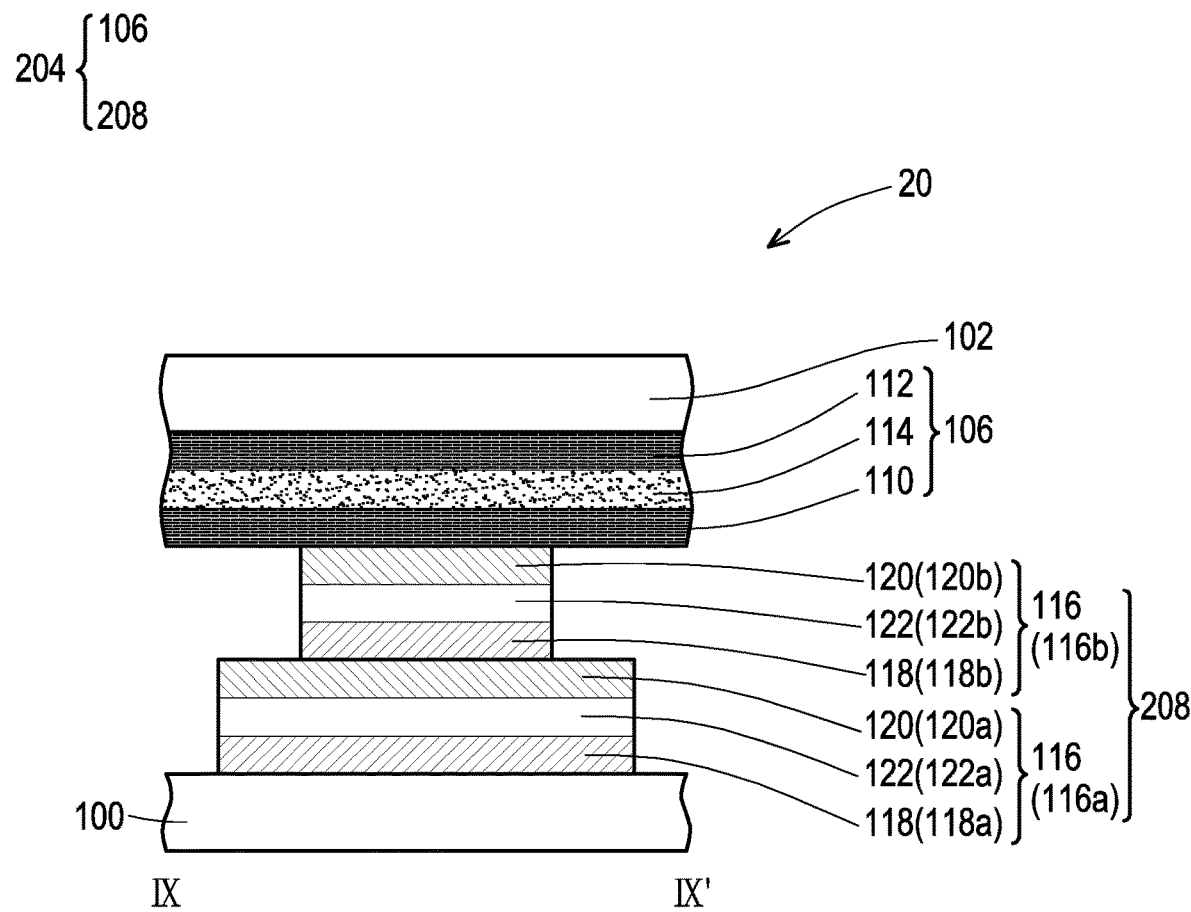
FIG. 6A is a cross-sectional view taken along section line IX-IX' in FIG. 5A.
Figure 6B:
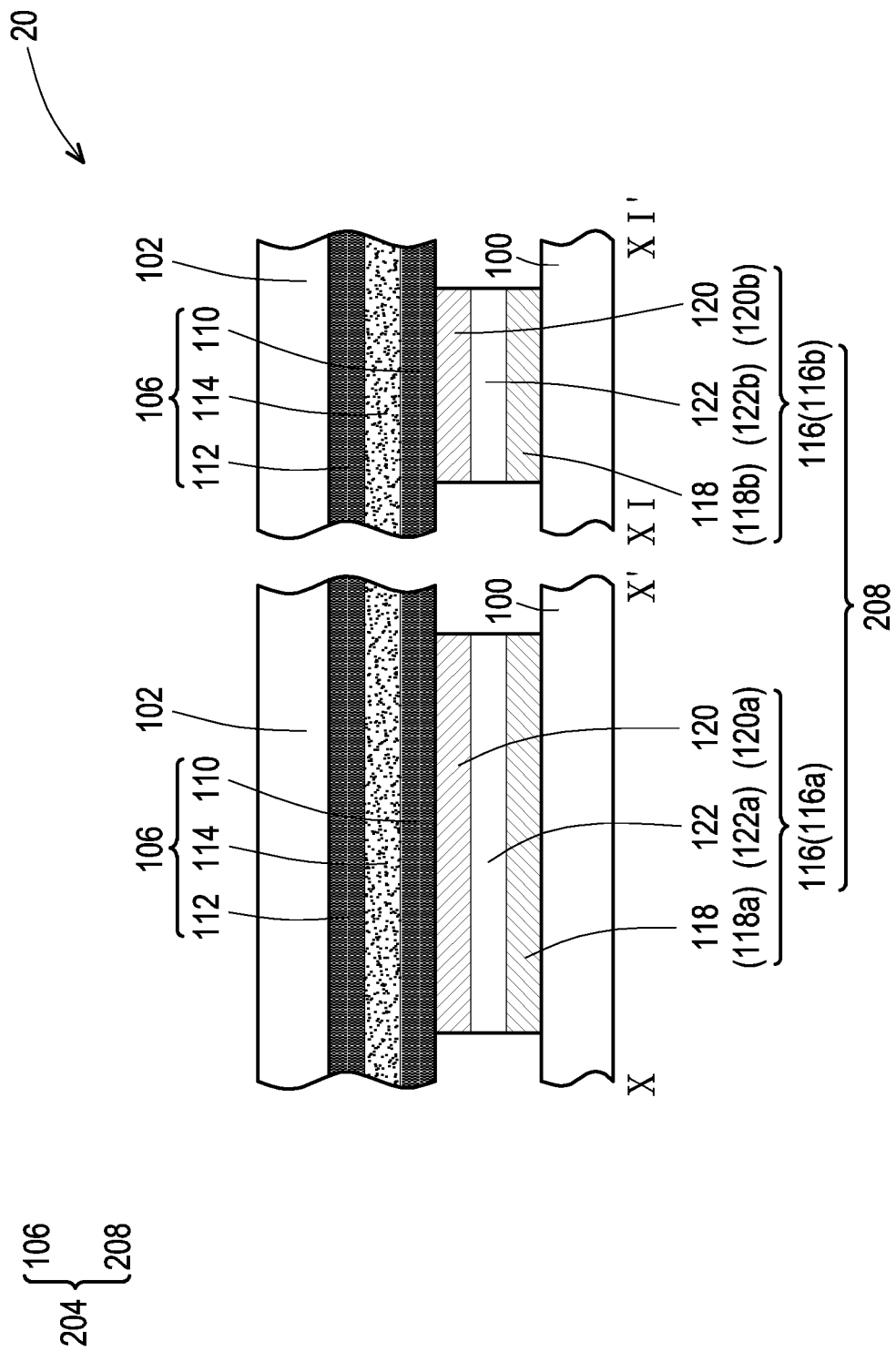
FIG. 6B is a cross-sectional view taken along section line X-X' and section line XI-XI' in FIG. 5B.
Figure 6C:
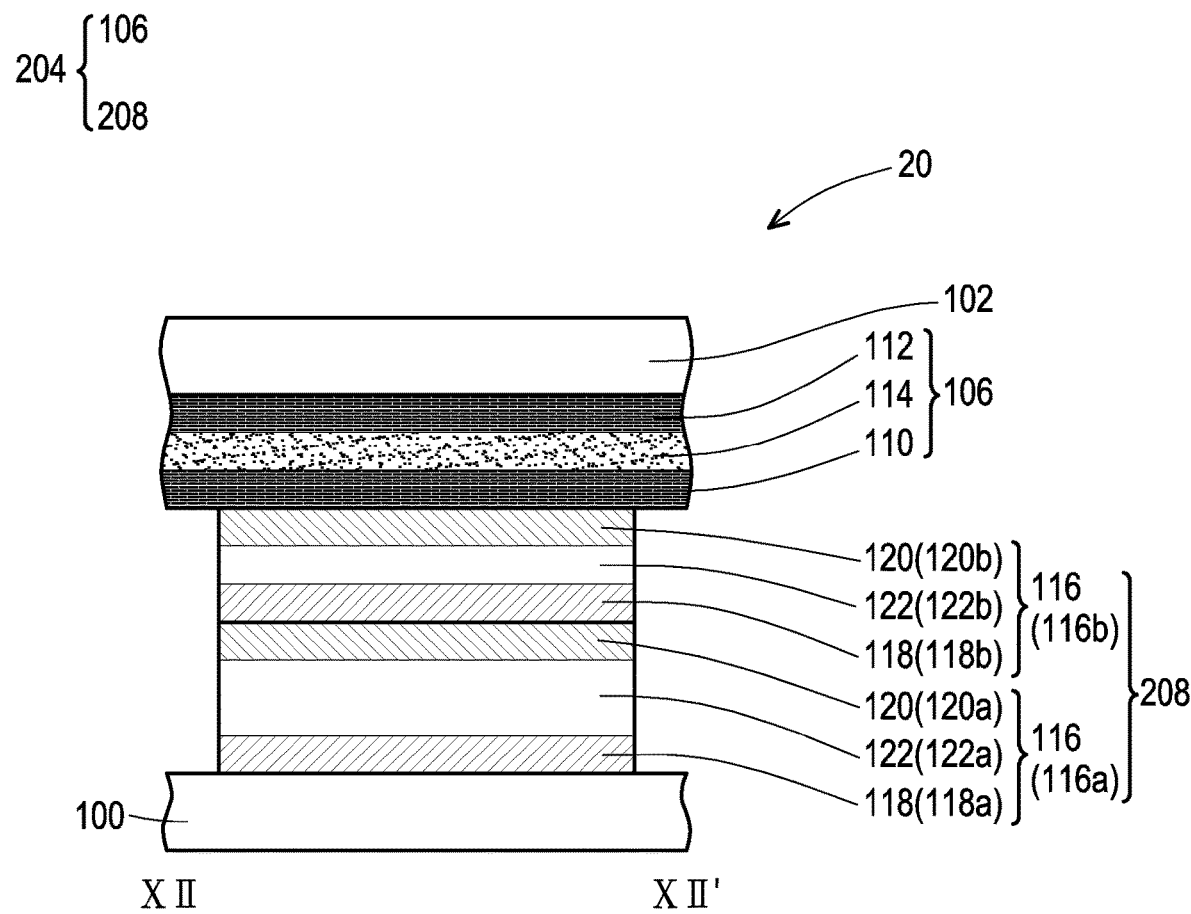
FIG. 6C is a cross-sectional view taken along section line XII-XII' in FIG. 5C.
Figure 6D:
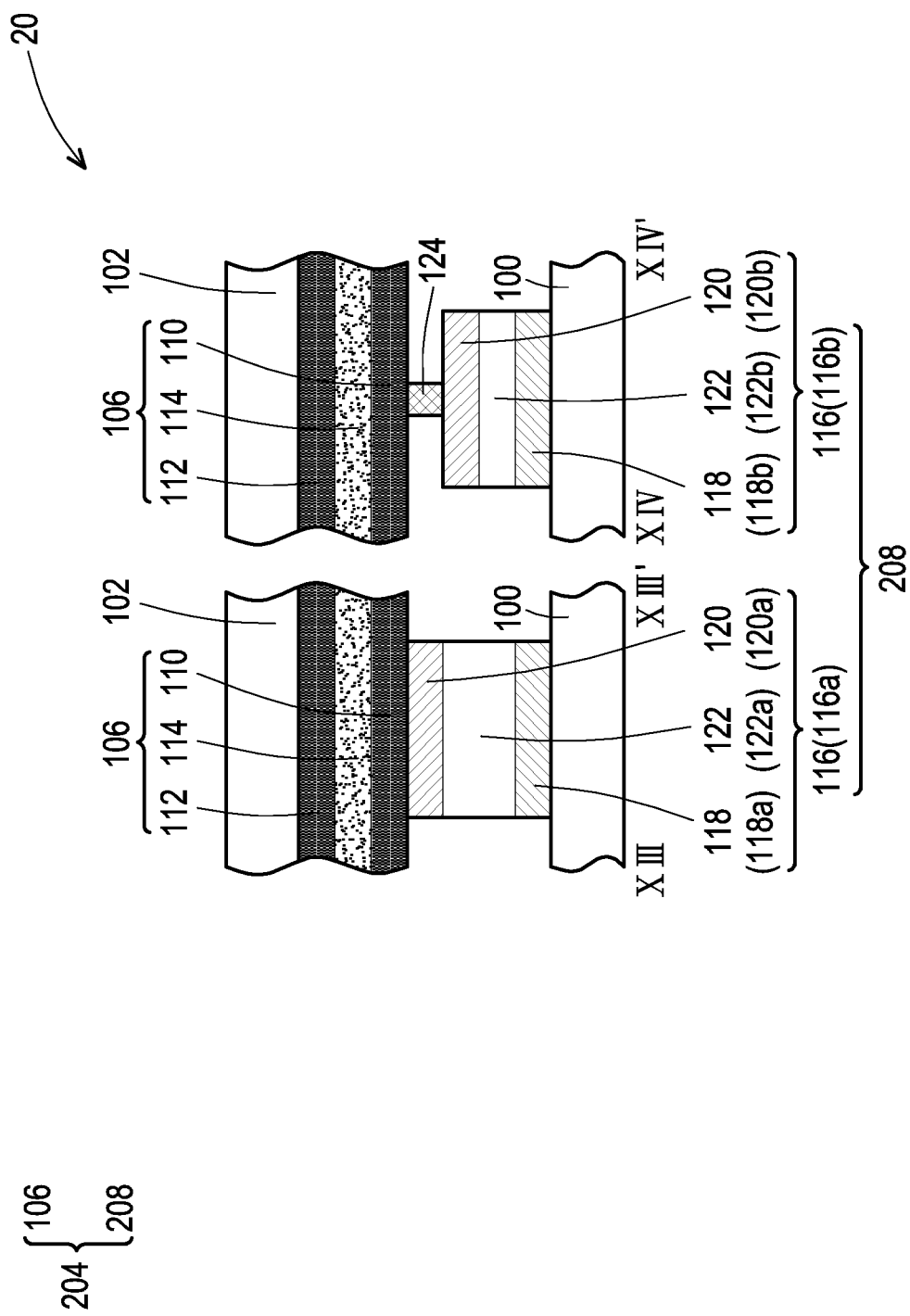
FIG. 6D is a cross-sectional view taken along section line XIII-XIII' and section line XIV-XIV' in FIG. 5D.

FIG. 4 is a schematic perspective view illustrating a ferroelectric memory structure according to another embodiments of the invention. FIG. 5A to FIG. 5D are schematic perspective views illustrating a ferroelectric capacitor structure and a conductive line in FIG. 4 according to another embodiments of the invention. FIG. 6A is a cross-sectional view taken along section line IX-IX' in FIG. 5A. FIG. 6B is a cross-sectional view taken along section line X-X' and section line XI-XI' in FIG. 5B. FIG. 6C is a cross-sectional view taken along section line XII-XII' in FIG. 5C. FIG. 6D is a cross-sectional view taken along section line XIII-XIII' and section line XIV-XIV' in FIG. 5D. In addition, in FIG. 5A to FIG. 5D, some components in FIG. 6A to FIG. 6D are omitted to clearly illustrate the configuration relationship between the components in FIG. 5A to FIG. 5D.

Referring to FIG. 1 to FIG. 6D, the difference between the ferroelectric memory structure 20 in FIG. 4 to FIG. 6D and the ferroelectric memory structure 10 in FIG. 1 to FIG. 3D is described as follows. In the ferroelectric memory structure 20, the number of the ferroelectric capacitors 116 of the ferroelectric capacitor structure 208 is two. For example, the ferroelectric capacitor structure 208 may include the ferroelectric capacitor 116a and the ferroelectric capacitor 116b. Furthermore, in FIG. 6A and FIG. 6C, since the ferroelectric capacitor structure 208 does not include the ferroelectric capacitor 116c in FIG. 3A and FIG. 3C, the conductive layer 120b of the ferroelectric capacitor 116b may be electrically connected to the semiconductor layer 110 of the switch device 106.

Moreover, the same or similar components in the ferroelectric memory structure 20 and the ferroelectric memory structure 10 are denoted by the same or similar symbols, and the same or similar content in the ferroelectric memory structure 20 and the ferroelectric memory structure 10 may be referred to the description of the ferroelectric memory structure 10 in the foregoing embodiment, and the description thereof is omitted here. In addition, the ferroelectric memory structure 20 may further include other required dielectric layers (for isolation) and/or other required interconnect structures (for electrical connection), and the description thereof is omitted here.

TABLE 1

| | storage state | | | | | | | |
|---|---|---|---|---|---|---|---|---|
| | 000 | 001 | 010 | 011 | 100 | 101 | 110 | 111 |
| series impedance | series impedance of $Z_{L1}$, $Z_{L2}$, and $Z_{L3}$ | series impedance of $Z_{L1}$, $Z_{L2}$, and $Z_{H3}$ | series impedance of $Z_{L1}$, $Z_{H2}$, and $Z_{L3}$ | series impedance of $Z_{L1}$, $Z_{H2}$, and $Z_{H3}$ | series impedance of $Z_{H1}$, $Z_{L2}$, and $Z_{L3}$ | series impedance of $Z_{H1}$, $Z_{L2}$, and $Z_{H3}$ | series impedance of $Z_{H1}$, $Z_{H2}$, and $Z_{L3}$ | series impedance of $Z_{H1}$, $Z_{H2}$, and $Z_{H3}$ |
| parallel impedance | parallel impedance of $Z_{L1}$, $Z_{L2}$, and $Z_{L3}$ | parallel impedance of $Z_{L1}$, $Z_{L2}$, and $Z_{H3}$ | parallel impedance of $Z_{L1}$, $Z_{H2}$, and $Z_{L3}$ | parallel impedance of $Z_{L1}$, $Z_{H2}$, and $Z_{H3}$ | parallel impedance of $Z_{H1}$, $Z_{L2}$, and $Z_{L3}$ | parallel impedance of $Z_{H1}$, $Z_{L2}$, and $Z_{H3}$ | parallel impedance of $Z_{H1}$, $Z_{H2}$, and $Z_{L3}$ | parallel impedance of $Z_{H1}$, $Z_{H2}$, and $Z_{H3}$ |

Based on the above embodiments, in the ferroelectric memory structure 10, a single memory cell 104 includes the ferroelectric capacitors 116 electrically connected, and the ferroelectric material layers 122 in the ferroelectric capacitors 116 have different top-view areas or different thicknesses. Therefore, a single memory cell 104 can store multiple bits of data, thereby increasing the bit density of the memory device.

Hereinafter, Table 2 is used to illustrate various storage states of the memory cell 204 of the ferroelectric memory structure 20. By controlling the voltages applied to the conductive line 100 and the conductive line 102, the ferroelectric capacitor 116 may have a polarization state of "positive (+) direction" or a polarization state of "negative (−) direction". When the ferroelectric capacitor 116 has the polarization state of "positive (+) direction", the ferroelectric capacitor 116 may have a low impedance $Z_L$ and is regarded as storing a first data (e.g., data "0"). When the ferroelectric capacitor 116 has the polarization state of "negative (−) direction", the ferroelectric capacitor 116 may have a high impedance $Z_H$ and is regarded as storing a second data (e.g., data "1"). In the present embodiment, the impedance is, for example, a capacitance, but the invention is not limited thereto. Thus, when the memory cell 204 is operated, by controlling the voltages applied to the conductive line 100 and the conductive line 102, the ferroelectric capacitor 116a may have a low impedance $Z_{L1}$ or a high impedance $Z_{H1}$, and the ferroelectric capacitor 116b may have a low impedance $Z_{L2}$ or a high impedance $Z_{H2}$. Therefore, a single memory cell 204 may have 4 different storage states (i.e., "00", "01", "10", and "011"). That is, a single memory cell 204 may store 2 bits of data.

TABLE 2

| | storage state | | | |
|---|---|---|---|---|
| | 00 | 01 | 10 | 11 |
| series impedance | series impedance of $Z_{L1}$ and $Z_{L2}$ | series impedance of $Z_{L1}$ and $Z_{H2}$ | series impedance of $Z_{H1}$ and $Z_{L2}$ | series impedance of $Z_{H1}$ and $Z_{H2}$ |
| parallel impedance | parallel impedance of $Z_{L1}$ and $Z_{L2}$ | parallel impedance of $Z_{L1}$ and $Z_{H2}$ | parallel impedance of $Z_{H1}$ and $Z_{L2}$ | parallel impedance of $Z_{H1}$ and $Z_{H2}$ |

Based on the above embodiments, in the ferroelectric memory structure 20, a single memory cell 204 includes the ferroelectric capacitors 116 electrically connected, and the ferroelectric material layers 122 in the ferroelectric capacitors 116 have different top-view areas or different thicknesses. Therefore, a single memory cell 204 can store multiple bits of data, thereby increasing the bit density of the memory device.

In summary, in the ferroelectric memory structure of the aforementioned embodiments, a single memory cell includes ferroelectric capacitors that are electrically connected and have different impedances (e.g., capacitances). Therefore, a single memory cell can store multiple bits of data, thereby increasing the bit density of the memory device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A ferroelectric memory structure, comprising:
a first conductive line;
a second conductive line disposed on the first conductive line; and
a memory cell disposed between the first conductive line and the second conductive line and comprising:
a switch device disposed between the first conductive line and the second conductive line; and
a ferroelectric capacitor structure disposed between the first conductive line and the switch device and comprising ferroelectric capacitors electrically connected, wherein each of the ferroelectric capacitors comprises:
a first conductive layer;
a second conductive layer disposed on the first conductive layer; and
a ferroelectric material layer disposed between the first conductive layer and the second conductive layer, wherein the ferroelectric material layers in the ferroelectric capacitors have different top-view areas, wherein
the switch device is a bipolar junction transistor, and the switch device comprises:
a first semiconductor layer;
a second semiconductor layer disposed on the first semiconductor layer; and
a third semiconductor layer disposed between the first semiconductor layer and the second semiconductor layer, wherein the first semiconductor layer and the second semiconductor layer have a first conductive type, and the third semiconductor layer has a second conductive type, wherein
a material of the first semiconductor layer and a material of the second semiconductor layer comprise one of a P-type oxide semiconductor and an N-type oxide semiconductor, and a material of the third semiconductor layer comprises the other of the P-type oxide semiconductor and the N-type oxide semiconductor.

2. The ferroelectric memory structure according to claim 1, wherein the ferroelectric capacitors are connected in series.

3. The ferroelectric memory structure according to claim 1, wherein the ferroelectric capacitors are connected in parallel.

4. The ferroelectric memory structure according to claim 1, wherein the ferroelectric capacitors are located between the same first conductive line and the same switch device.

5. The ferroelectric memory structure according to claim 1, wherein a material of the ferroelectric material layer comprises hafnium zirconium oxide, lead zirconate titanate, strontium titanium oxide, barium titanate, or bismuth ferrite.

6. The ferroelectric memory structure according to claim 1, wherein the P-type oxide semiconductor comprises cobalt oxide, nickel oxide, strontium copper oxide, copper aluminum oxide, copper indium oxide, or copper gallium oxide.

7. The ferroelectric memory structure according to claim 1, wherein the N-type oxide semiconductor comprises indium gallium zinc oxide, zinc oxide, or indium zinc oxide.

8. The ferroelectric memory structure according to claim 1, comprising a plurality of the first conductive lines, a plurality of the second conductive lines, and a plurality of the memory cells to form a memory array.

9. The ferroelectric memory structure according to claim 8, comprising a plurality of the memory arrays arranged in a stack.

10. A ferroelectric memory structure, comprising:
a first conductive line;
a second conductive line disposed on the first conductive line; and
a memory cell disposed between the first conductive line and the second conductive line and comprising:
a switch device disposed between the first conductive line and the second conductive line; and
a ferroelectric capacitor structure disposed between the first conductive line and the switch device and comprising ferroelectric capacitors electrically connected, wherein each of the ferroelectric capacitors comprises:

a first conductive layer;
a second conductive layer disposed on the first conductive layer; and
a ferroelectric material layer disposed between the first conductive layer and the second conductive layer, wherein the ferroelectric material layers in the ferroelectric capacitors have different thicknesses, wherein the switch device is a bipolar junction transistor, and the switch device comprises:
  a first semiconductor layer;
  a second semiconductor layer disposed on the first semiconductor layer; and
  a third semiconductor layer disposed between the first semiconductor layer and the second semiconductor layer, wherein the first semiconductor layer and the second semiconductor layer have a first conductive type, and the third semiconductor layer has a second conductive type, wherein
  a material of the first semiconductor layer and a material of the second semiconductor layer comprise one of a P-type oxide semiconductor and an N-type oxide semiconductor, and a material of the third semiconductor layer comprises the other of the P-type oxide semiconductor and the N-type oxide semiconductor.

11. The ferroelectric memory structure according to claim 10, wherein the ferroelectric capacitors are connected in series.

12. The ferroelectric memory structure according to claim 10, wherein the ferroelectric capacitors are connected in parallel.

13. The ferroelectric memory structure according to claim 10, wherein the ferroelectric capacitors are located between the same first conductive line and the same switch device.

14. The ferroelectric memory structure according to claim 10, wherein a material of the ferroelectric material layer comprises hafnium zirconium oxide, lead zirconate titanate, strontium titanium oxide, barium titanate, or bismuth ferrite.

15. The ferroelectric memory structure according to claim 10, wherein the P-type oxide semiconductor comprises cobalt oxide, nickel oxide, strontium copper oxide, copper aluminum oxide, copper indium oxide, or copper gallium oxide.

16. The ferroelectric memory structure according to claim 10, wherein the N-type oxide semiconductor comprises indium gallium zinc oxide, zinc oxide, or indium zinc oxide.

17. The ferroelectric memory structure according to claim 10, comprising a plurality of the first conductive lines, a plurality of the second conductive lines, and a plurality of the memory cells to form a memory array.

18. The ferroelectric memory structure according to claim 17, comprising a plurality of the memory arrays arranged in a stack.

* * * * *